United States Patent
Tu et al.

(10) Patent No.: US 10,109,293 B2
(45) Date of Patent: Oct. 23, 2018

(54) VOICE SIGNAL PROCESSING APPARATUS AND VOICE SIGNAL PROCESSING METHOD

(71) Applicant: Acer Incorporated, New Taipei (TW)

(72) Inventors: Po-Jen Tu, New Taipei (TW); Jia-Ren Chang, New Taipei (TW); Kai-Meng Tzeng, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 15/458,405

(22) Filed: Mar. 14, 2017

(65) Prior Publication Data

US 2018/0166092 A1    Jun. 14, 2018

(30) Foreign Application Priority Data

Dec. 9, 2016  (TW) .............................. 105140845 A

(51) Int. Cl.
*H03G 3/00* (2006.01)
*G10L 21/034* (2013.01)
*H03G 9/00* (2006.01)
*H04R 25/00* (2006.01)

(52) U.S. Cl.
CPC ............ *G10L 21/034* (2013.01); *H03G 9/00* (2013.01); *H04R 25/356* (2013.01); *H04R 2225/43* (2013.01)

(58) Field of Classification Search
CPC ............... H03G 3/00; H03G 5/00; H03G 3/20
See application file for complete search history.

(56) References Cited

U.S. PATENT DOCUMENTS

| | | | | |
|---|---|---|---|---|
| 4,843,626 A | * | 6/1989 | Werrbach ............... | H03G 9/005 381/106 |
| 2005/0078838 A1 | * | 4/2005 | Simon ..................... | A61B 5/121 381/98 |
| 2007/0291959 A1 | * | 12/2007 | Seefeldt .................... | H03G 3/32 381/104 |
| 2008/0219459 A1 | * | 9/2008 | Bongiovi ............... | H03G 9/005 381/57 |
| 2011/0110533 A1 | * | 5/2011 | Choi ...................... | H03G 9/005 381/99 |
| 2012/0039490 A1 | * | 2/2012 | Smithers ................ | H03G 9/005 381/107 |

FOREIGN PATENT DOCUMENTS

TW    I397901    6/2013

* cited by examiner

*Primary Examiner* — Shreyans A Patel
(74) *Attorney, Agent, or Firm* — J.C. Patents

(57) ABSTRACT

A voice signal processing apparatus and a voice signal processing method are provided. A filtering loudness gain of a filter signal of each frequency band is adjusted according to a wide dynamic range compression curve without an upper output loudness limit. The filtering loudness gain of each frequency band is reduced by lowering a gain decrease adjustment value, so as to reduce a loudness of a loudness adjusted filter signal, and thus a loudness of an output voice signal is lower than a first threshold value.

8 Claims, 3 Drawing Sheets

VOICE SIGNAL PROCESSING APPARATUS AND VOICE SIGNAL PROCESSING METHOD

CROSS-REFERENCE TO RELATED APPLICATION

This application claims the priority benefit of Taiwan application serial no. 105140845, filed on Dec. 9, 2016. The entirety of the above-mentioned patent application is hereby incorporated by reference herein and made a part of this specification.

BACKGROUND OF THE INVENTION

Field of the Invention

The invention relates to a signal processing apparatus and more particularly relates to a voice signal processing apparatus and a voice signal processing method.

Description of Related Art

The multi-frequency band WDRC (wide dynamic range compression) technology is extensively used in the field of hearing aids. Wide dynamic range compression is mainly to improve the loudness gain for a voice signal with low loudness to facilitate identification as well as reduce the loudness gain for a voice signal with high loudness to avoid generating a loud voice that causes discomfort. Moreover, in order to prevent the loudness of the output voice signal from exceeding a range that human ears can tolerate, the loudness needs to be limited to a certain range to avoid hearing loss problem.

The general multi-frequency band WDRC is to process the voice signal of each frequency band independently, and the WDRC curve of each frequency band is determined by the hearing test subject to individual needs. When the WDRC processing is performed on an input voice signal, the loudness of the output voice signal of each frequency band is determined respectively by the corresponding wide dynamic range compression curve with reference to the loudness detection result of the voice signal of each frequency band. The wide dynamic range compression curve corresponding to each frequency band includes a protection mechanism for limiting loudness, so as to keep the loudness of the voice signal of each frequency band below the loudness limit value of the corresponding frequency band and thereby prevent an output voice signal with an excessive loudness. Such processing may prevent an excessive loudness of the output voice signal but may also reduce the loudness gap between the voice signals of different frequency bands. As a result, the voice quality of the output voice signal obtained by combining the voice signals of respective frequency bands may be impaired.

SUMMARY OF THE INVENTION

The invention provides a voice signal processing apparatus and a voice signal processing method for significantly improving the voice quality of an output voice signal.

The voice signal processing apparatus of the invention includes a filtering part and a processing part. The filtering part receives an input voice signal and filters the input voice signal to generate a plurality of filter signals of different frequency bands. The processing part detects loudnesses of the filter signals to obtain a plurality of filter loudnesses, and respectively calculates filtering loudness gains of the frequency bands according to the filter loudnesses and wide dynamic range compression curves corresponding to the frequency bands. Each of the wide dynamic range compression curves does not have an upper output loudness limit. The processing part multiplies the filtering loudness gains by a gain decrease adjustment value to obtain a plurality of adjustment gains, respectively multiplies the adjustment gains of the frequency bands by the corresponding filter signals to obtain a plurality of loudness adjusted filter signals, adds up the loudness adjusted filter signals to generate a total filter signal, detects a loudness of the total filter signal, and determines if the loudness of the total filter signal is less than a first threshold value. If the loudness of the total filter signal is not less than the first threshold value, the gain decrease adjustment value is reduced until the loudness of the total filter signal is less than the first threshold value, and if the loudness of the total filter signal is less than the first threshold value, the total filter signal is set as an output voice signal.

In an embodiment of the invention, the processing part further reduces the gain decrease adjustment value according to a ratio of a second threshold value to the loudness of the total filter signal. The second threshold value is less than or equal to the first threshold value.

In an embodiment of the invention, the second threshold value is less than the first threshold value by an error value.

In an embodiment of the invention, the gain decrease adjustment value is equal to a product obtained by multiplying a previously used gain decrease adjustment value by a square root value of the ratio of the second threshold value to the loudness of the total filter signal.

In an embodiment of the invention, the wide dynamic range compression curves are obtained by performing wide dynamic range compression processes corresponding to the frequency bands on a unit gain curve, and the processing part further calculates the filtering loudness gains corresponding to the frequency bands according to first output loudnesses corresponding to the filter loudnesses of the frequency bands on the wide dynamic range compression curves of the frequency bands and second output loudnesses corresponding to the filter loudnesses of the frequency bands on the unit gain curve.

The voice signal processing method of the invention includes the following. An input voice signal is received. The input voice signal is filtered to generate a plurality of filter signals of different frequency bands. Loudnesses of the filter signals are detected to obtain a plurality of filter loudnesses. Filtering loudness gains of the frequency bands are calculated according to each of the filter loudnesses and wide dynamic range compression curves corresponding to the frequency bands, wherein each of the wide dynamic range compression curves does not have an upper output loudness limit. The filtering loudness gains are multiplied by a gain decrease adjustment value to obtain a plurality of adjustment gains. The adjustment gains of the frequency bands are respectively multiplied by the corresponding filter signals to obtain a plurality of loudness adjusted filter signals. The loudness adjusted filter signals are added up to generate a total filter signal. A loudness of the total filter signal is detected. Whether the loudness of the total filter signal is less than a first threshold value is determined. If the loudness of the total filter signal is not less than the first threshold value, the gain decrease adjustment value is reduced until the loudness of the total filter signal is less than the first threshold value. If the loudness of the total filter signal is less than the first threshold value, the total filter signal is set as an output voice signal.

In an embodiment of the invention, the voice signal processing method further includes: reducing the gain decrease adjustment value according to a ratio of a second threshold value to the loudness of the total filter signal, wherein the second threshold value is less than or equal to the first threshold value.

In an embodiment of the invention, the second threshold value is less than the first threshold value by an error value.

In an embodiment of the invention, the gain decrease adjustment value is equal to a product obtained by multiplying a previously used gain decrease adjustment value by a square root value of the ratio of the second threshold value to the loudness of the total filter signal.

In an embodiment of the invention, the wide dynamic range compression curves are obtained by performing wide dynamic range compression processes corresponding to the frequency bands on a unit gain curve, and the filtering loudness gains corresponding to the frequency bands are calculated according to first output loudnesses corresponding to the filter loudnesses of the frequency bands on the wide dynamic range compression curves of the frequency bands and second output loudnesses corresponding to the filter loudnesses of the frequency bands on the unit gain curve.

Based on the above, in the embodiments of the invention, the filtering loudness gain of the filter signal of each frequency band is adjusted according to the wide dynamic range compression curve without the upper output loudness limit, and the filtering loudness gain of each frequency band is reduced by lowering the gain decrease adjustment value, so as to reduce the loudness of the loudness adjusted filter signal and make the loudness of the output voice signal less than the first threshold value. Thus, the invention prevents the loudness gap between the filter signals of different frequency bands from being drastically reduced due to the loudness limit of the wide dynamic range compression curve, and thereby improves the voice quality of the output voice signal.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1:
FIG. 1 is a schematic diagram of a voice signal processing apparatus according to an embodiment of the invention.

FIG. 1 is a schematic diagram of a voice signal processing apparatus according to an embodiment of the invention.

Please refer to FIG. 1. The voice signal processing apparatus includes a filtering part 102 and a processing part 104. The filtering part 102 is coupled to the processing part 104, wherein the filtering part 102 may be implemented by a bandpass filter and the processing part 104 may be implemented by a central processing unit, for example. Nevertheless, the invention is not limited thereto.

The filtering part 102 filters an input voice signal SI1, so as to generate a plurality of filter signals SF1 to SFN of different frequency bands to be provided to the processing part 104, wherein N is a positive integer greater than 1. The processing part 104 may detect a loudness of each of the filter signals SF1 to SFN to obtain a plurality of filter loudnesses, and calculate filtering loudness gains of the frequency bands according to filter loudnesses and wide dynamic range compression curves corresponding to the frequency bands. Each wide dynamic range compression curve does not have an upper output loudness limit, and the wide dynamic range compression curves corresponding to the frequency bands are curves obtained by performing wide dynamic range compression processes corresponding to the frequency bands on a unit gain curve. Each of the wide dynamic range compression curves of the frequency bands is determined by a hearing test subject to individual needs, and the wide dynamic range compression curves corresponding to different frequency bands may be different. Specifically, the processing part 104 may calculate a filtering loudness gain according to an output loudness of a corresponding filter loudness on a wide dynamic range compression curve corresponding to a frequency band and an output loudness of the corresponding filter loudness on an unit gain curve.

The processing part 104 may multiply the filtering loudness gain of each frequency band by a gain decrease adjustment value (an initial value of the gain decrease adjustment value may be set to 1, but not limited thereto) to obtain a plurality of adjustment gains, respectively multiply the adjustment gain of each frequency band by the corresponding filter signal to obtain a plurality of loudness adjusted filter signals, and add up the loudness adjusted filter signals to generate a total filter signal. The processing part 104 may detect a loudness of the total filter signal and determine whether the loudness of the total filter signal is less than a first threshold value. If the loudness of the total filter signal is not less than the first threshold value, the gain decrease adjustment value is reduced until the loudness of the total filter signal is less than the first threshold value, and if the loudness of the total filter signal is less than the first threshold value, the total filter signal is used as an output voice signal. The processing part 104 may reduce the gain decrease adjustment value according to a ratio of a second threshold value to the loudness of the total filter signal, for example. Moreover, the second threshold value may be less than or equal to the first threshold value, for example. In some embodiments, the second threshold value may be set less than the first threshold value by an error value. For example, the first threshold value may be set equal to the second threshold value multiplied by 1.01. That is, the second threshold value is set less than the first threshold value by 10% of the second threshold value. Nevertheless, the invention is not limited thereto.

Accordingly, the filtering loudness gain of the filter signal of each frequency band is adjusted according to the wide dynamic range compression curve without the upper output loudness limit, and the filtering loudness gain of each frequency band is reduced by lowering the gain decrease adjustment value, so as to reduce the loudness of the loudness adjusted filter signal, which is different from the conventional technology that reduces the loudness of the filter signal according to a wide dynamic range compression curve that has a maximum loudness limit. Thus, the voice signal processing apparatus of this embodiment prevents a loudness gap between the filter signals of different frequency bands from being drastically reduced by the loudness limit of the wide dynamic range compression curve, and thereby improves the voice quality of the output voice signal.

Figure 2:
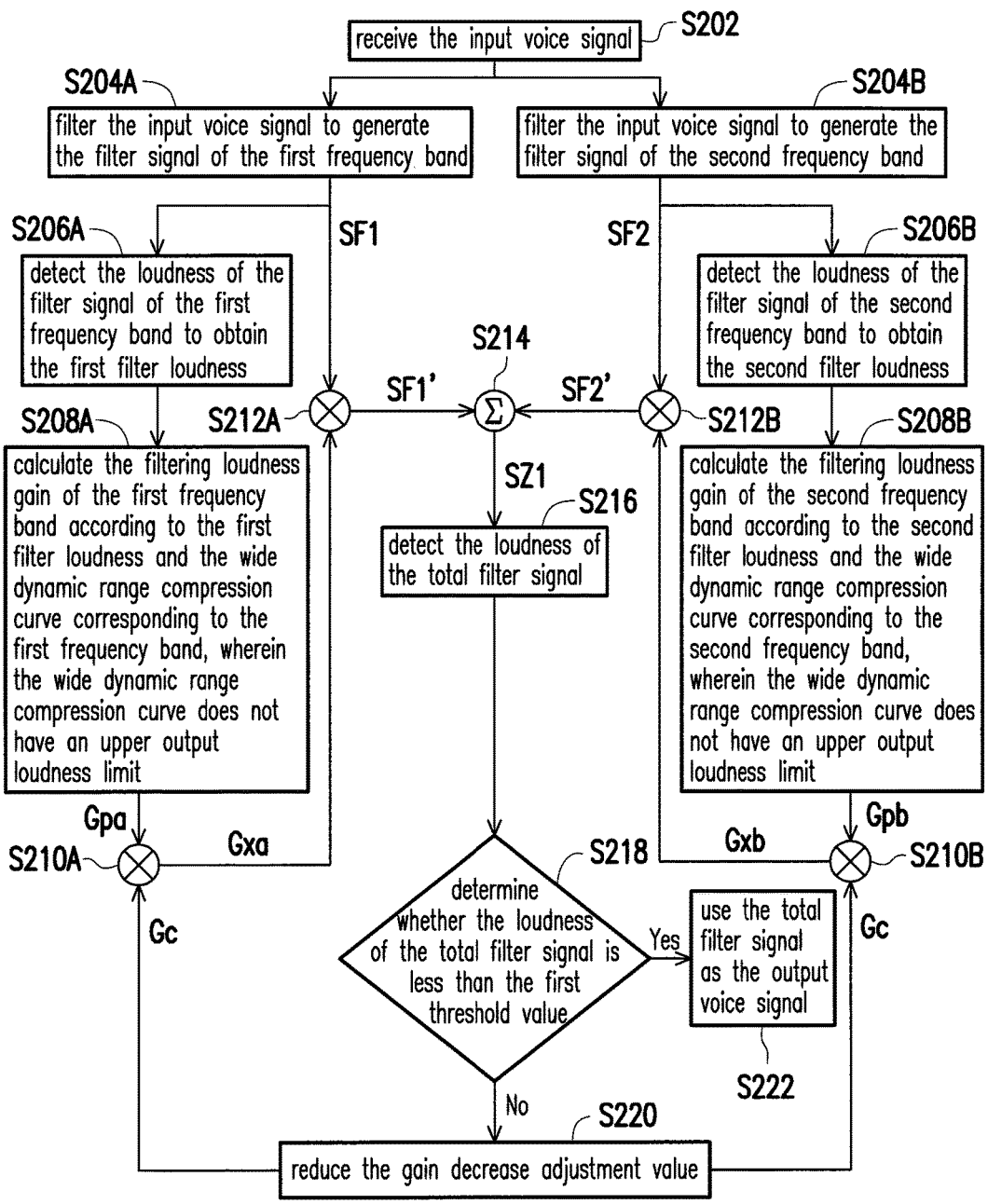
FIG. 2 is a flowchart of a voice signal processing method according to an embodiment of the invention.

For example, FIG. 2 is a flowchart of a voice signal processing method according to an embodiment of the invention. Please refer to FIG. 2. In this embodiment, generation of the filter signals SF1 and SF2 of two different frequency bands is described as an example. However, the invention is not limited thereto. In other embodiments, the filtering part 102 may generate more filter signals of different frequency bands. The voice signal processing method of this embodiment includes steps as follows. First, the filtering part 102 receives the input voice signal SI1 (Step S202) and filters the input voice signal SI1, so as to generate the filter signal SF1 of a first frequency band (Step S204A) and the filter signal SF2 of a second frequency band (Step S204B). The processing part 104 may detect the loudness of the filter signal SF1 of the first frequency band to obtain a first filter loudness (Step S206A) and calculate a filtering loudness gain Gpa of the first frequency band according to the first filter loudness and a wide dynamic range compression curve corresponding to the first frequency band (Step S208A). Likewise, the processing part 104 may detect the loudness of the filter signal SF2 of the second frequency band to obtain a second filter loudness (Step S206B) and calculate a filtering loudness gain Gpb of the second frequency band according to the second filter loudness and a wide dynamic range compression curve corresponding to the second frequency band (Step S208B). The wide dynamic range compression curves of the first frequency band and the second frequency band do not have an upper output loudness limit.

Figure 3:
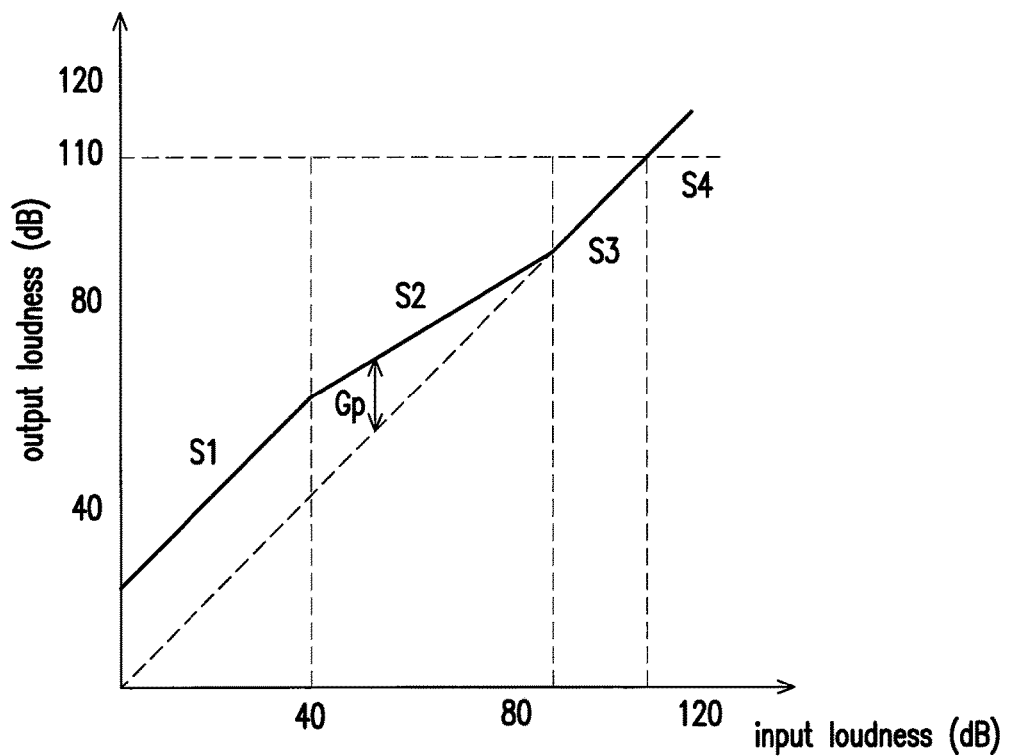
FIG. 3 is a chart showing a wide dynamic range compression curve according to an embodiment of the invention.

For example, the wide dynamic range compression curves of the first frequency band and the second frequency band may be the wide dynamic range compression curve shown in FIG. 3. The wide dynamic range compression curve of the embodiment of FIG. 3 is divided into a plurality of sections S1 to S4, wherein the section S1 is a linear section, the section S2 is a compressed section, and the sections S3 and S4 are linear sections. In addition, the dotted line is the unit gain curve. That is, the input loudness of the signal is equal to the output loudness. The section S1 may be used to amplify weak voices for people having hearing problems, and the section S2 may be used to adjust the dynamic range of the user's range of hearing. In the section S3, the wide dynamic range compression curve and the unit gain curve overlap, because people having hearing problems have the same saturated sound pressure as normal people, which does not need to be amplified. Moreover, according to the conventional technology, a maximum loudness value for limiting the output voice signal SO1 is set in the section S4 (for example, the maximum of the output loudness is set to 110 dB). In contrast thereto, in this embodiment, the section S4 and the section S3 are the same, which are linear sections with no limit on the output loudness. The processing part 104 may calculate the filtering loudness gain Gp according to the output loudness of the corresponding filter loudness on the wide dynamic range compression curve corresponding to each frequency band and the output loudness of the corresponding filter loudness on the unit gain curve.

It should be noted that, in this embodiment, it is assumed the wide dynamic range compression curves corresponding to the first frequency band and the second frequency band are as shown in FIG. 3, but the invention is not limited thereto. In other embodiments, the wide dynamic range compression curves corresponding to the first frequency band and the second frequency band may be different from the wide dynamic range compression curve of FIG. 3, and the first frequency band and the second frequency band may correspond to different wide dynamic range compression curves.

Then, after Step S208A and Step S208B, the processing part 104 may multiply the filtering loudness gain Gpa of the first frequency band and the filtering loudness gain Gpb of the second frequency band respectively by the gain decrease adjustment value Gc, so as to obtain a first adjustment gain Gxa and a second adjustment gain Gxb (Step S210A and Step S210B). If the filtering loudness gain Gpa of the first frequency band and the filtering loudness gain Gpb of the second frequency band are generated for the first time, the gain decrease adjustment value Gc may be set to the initial value "1," for example. Thereafter, the processing part 104 multiplies the filter signal SF1 of the first frequency band by the filtering loudness gain Gpa of the first frequency band to obtain a first loudness adjusted filter signal SF1' (Step S212A), and multiplies the filter signal SF2 of the second frequency band by the filtering loudness gain Gpb of the second frequency band to obtain a second loudness adjusted filter signal SF2' (Step S212B).

Next, the processing part 104 adds up the first loudness adjusted filter signal SF1' and the second loudness adjusted filter signal SF2' to generate a total filter signal SZ1 (Step S214), and then detects a loudness of the total filter signal SZ1 (Step S216) and determines whether the loudness of the total filter signal SZ1 is less than the first threshold value (Step S218). If the loudness of the total filter signal SZ1 is not less than the first threshold value, the gain decrease adjustment value is reduced (Step S220), and the process returns to Step S210A and Step S210B to recalculate the first adjustment gain Gxa and the second adjustment gain Gxb and then execute Steps S212A to S218. Steps S210A to S220 and S210B to S220 are repeated in this manner until the loudness of the total filter signal SZ1 is determined to be less than the first threshold value in Step S218, so as to use the total filter signal SZ1 as the output voice signal (S222).

The processing part 104 may reduce the gain decrease adjustment value according to the ratio of the second threshold value to the loudness of the total filter signal SZ1, for example. For example, the gain decrease adjustment value may be equal to a product obtained by multiplying the previously used gain decrease adjustment value by a square root value of the ratio of the second threshold value to the loudness of the total filter signal SZ1. In other words, the $i^{th}$ calculated gain decrease adjustment value $Gc(i)=Gc(i-1)\times(SPLlim/SPLz)^{0.5}$, wherein i is a positive integer greater than 1, Gc(1) is equal to 1, SPLlim is the second threshold value, and SPLz is the loudness of the total filter signal SZ1. It should be noted that, the method of calculating the gain decrease adjustment value is not limited to the above. In other embodiments, the gain decrease adjustment value Gc(i) may also be other functions including the parameter (SPLlim/SPLz), e.g., the gain decrease adjustment value $Gc(i)=Gc(i-1)\times(SPLlim/SPLz)^{0.25}$. Furthermore, as described in the above embodiment, the second threshold value may be less than or equal to the first threshold value, for example. In some embodiments, the second threshold value may be set less than the first threshold value by an error value. For example, the first threshold value may be set equal to the second threshold value multiplied by 1.01. That is, the error value is 10% of the second threshold value. Nevertheless, the invention is not limited thereto.

Accordingly, the filtering loudness gains of the filter signals SF1 and SF2 of the first frequency band and the second frequency band are adjusted according to the wide dynamic range compression curve without the upper output loudness limit, and the filtering loudness gains of the first frequency band and the second frequency band are reduced by lowering the gain decrease adjustment value, so as to reduce the loudnesses of the first loudness adjusted filter signal SF1' and the second loudness adjusted filter signal SF2' and thereby make the loudness of the output voice signal less than the first threshold value, which is different from the conventional technology that reduces the loudnesses of the filter signals SF1 and SF2 of the first frequency band and the second frequency band according to a wide dynamic range compression curve that has a maximum loudness limit. Thus, the voice signal processing method of this embodiment prevents the loudness gap between the filter signals of different frequency bands from being drastically reduced by the loudness limit of the wide dynamic range compression curve, and thereby improves the voice quality of the output voice signal.

Figure 4:
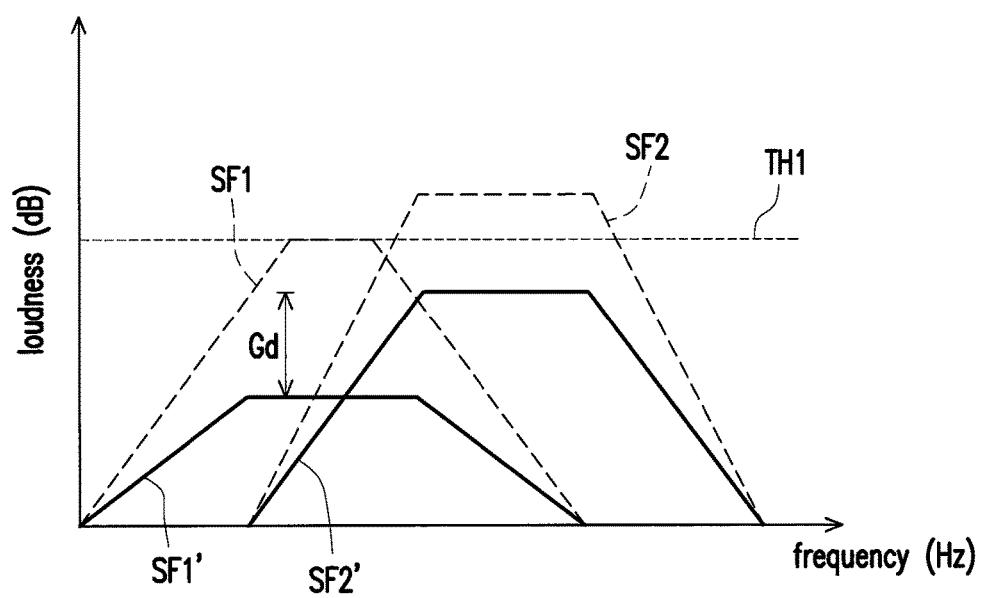
FIG. 4 is a chart showing the loudnesses of the filter signals of the first frequency band and the second frequency band and the loudness adjusted filter signals according to an embodiment of the invention.

For example, FIG. 4 is a chart illustrating the loudnesses of the filter signals of the first frequency band and the second frequency band and the loudness adjusted filter signals according to an embodiment of the invention. As shown in FIG. 4, it is assumed that TH1 is a protection limit value set for preventing hearing loss. When the gain decrease adjustment value Gc is reduced to lower the loudness of the output voice signal SO1 to be less than the protection limit value TH1 by the wide dynamic range compression process described in the embodiment of FIG. 2, the loudnesses of the first loudness adjusted filter signal SF1' of the first frequency band and the second loudness adjusted filter signal SF2' of the second frequency band (i.e., the filter signal SF1 and the filter signal SF2 with reduced loudnesses) will be reduced to be less than the protection limit value TH1 as well. The invention is unlike the conventional technology that uses the wide dynamic range compression curve with a loudness limit to limit the maximum output loudness of each frequency band. Thus, as shown in FIG. 4, in this embodiment, the obvious loudness gap Gd is present between the first loudness adjusted filter signal SF1' and the second loudness adjusted filter signal SF2'. Since the loudness gap between the filter signals is not drastically reduced due to the loudness limit of the wide dynamic range compression curve, the voice quality of the output voice signal SO1 is improved.

To conclude, in the embodiments of the invention, the filtering loudness gain of the filter signal of each frequency band is adjusted according to the wide dynamic range compression curve without the upper output loudness limit, and the filtering loudness gain of each frequency band is lowered by reducing the gain decrease adjustment value, so as to reduce the loudness of the loudness adjusted filter signal, which is different from the conventional technology that reduces the loudness of the filter signal according to the wide dynamic range compression curve that has a maximum loudness limit. Thus, the invention prevents the loudness gap between the filter signals of different frequency bands from being drastically reduced due to the loudness limit of the wide dynamic range compression curve, and thereby improves the voice quality of the output voice signal and makes the loudness of the output voice signal less than the first threshold value.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A voice signal processing apparatus, comprising:
a filtering part receiving an input voice signal and filtering the input voice signal to generate a plurality of filter signals of different frequency bands; and
a processing part detecting loudnesses of the filter signals to obtain a plurality of filter loudnesses, and calculating filtering loudness gains of the frequency bands according to the filter loudnesses and wide dynamic range compression curves corresponding to the frequency bands, wherein each of the wide dynamic range compression curves does not have an upper output loudness limit, and the processing part multiplies the filtering loudness gains by a gain decrease adjustment value to obtain a plurality of adjustment gains, respectively multiplies the adjustment gains of the frequency bands by the corresponding filter signals to obtain a plurality of loudness adjusted filter signals, adds up the loudness adjusted filter signals to generate a total filter signal, detects a loudness of the total filter signal, and determines if the loudness of the total filter signal is less than a first threshold value, wherein if the loudness of the total filter signal is not less than the first threshold value, the gain decrease adjustment value is reduced according to a ratio of a second threshold value to the loudness of the total filter signal, wherein the second threshold value is less than or equal to the first threshold value, until the loudness of the total filter signal is less than the first threshold value, and if the loudness of the total filter signal is less than the first threshold value, the total filter signal is set as an output voice signal.

2. The voice signal processing apparatus according to claim 1, wherein the second threshold value is less than the first threshold value by an error value.

3. The voice signal processing apparatus according to claim 1, wherein the gain decrease adjustment value is equal to a product obtained by multiplying a previously used gain decrease adjustment value by a square root value of the ratio of the second threshold value to the loudness of the total filter signal.

4. The voice signal processing apparatus according to claim 1, wherein the wide dynamic range compression curves are obtained by performing wide dynamic range compression processes corresponding to the frequency bands on a unit gain curve, and the processing part further calculates the filtering loudness gains corresponding to the frequency bands according to first output loudnesses corresponding to the filter loudnesses of the frequency bands on the wide dynamic range compression curves of the frequency bands and second output loudnesses corresponding to the filter loudnesses of the frequency bands on the unit gain curve.

5. A voice signal processing method, comprising:
receiving an input voice signal;
filtering the input voice signal to generate a plurality of filter signals of different frequency bands;
detecting loudnesses of the filter signals to obtain a plurality of filter loudnesses;
calculating filtering loudness gains of the frequency bands according to the filter loudnesses and wide dynamic range compression curves corresponding to the frequency bands, wherein each of the wide dynamic range compression curves does not have an upper output loudness limit;

multiplying the filtering loudness gains by a gain decrease adjustment value to obtain a plurality of adjustment gains;

respectively multiplying the adjustment gains of the frequency bands by the corresponding filter signals to obtain a plurality of loudness adjusted filter signals;

adding up the loudness adjusted filter signals to generate a total filter signal;

detecting a loudness of the total filter signal;

determining if the loudness of the total filter signal is less than a first threshold value;

if the loudness of the total filter signal is not less than the first threshold value, reducing the gain decrease adjustment value according to a ratio of a second threshold value to the loudness of the total filter signal, wherein the second threshold value is less than or equal to the first threshold value, until the loudness of the total filter signal is less than the first threshold value; and if the loudness of the total filter signal is less than the first threshold value, setting the total filter signal as an output voice signal.

6. The voice signal processing method according to claim 5, wherein the second threshold value is less than the first threshold value by an error value.

7. The voice signal processing method according to claim 5, wherein the gain decrease adjustment value is equal to a product obtained by multiplying a previously used gain decrease adjustment value by a square root value of the ratio of the second threshold value to the loudness of the total filter signal.

8. The voice signal processing method according to claim 5, wherein the wide dynamic range compression curves are obtained by performing wide dynamic range compression processes corresponding to the frequency bands on a unit gain curve, and the filtering loudness gains corresponding to the frequency bands are calculated according to first output loudnesses corresponding to the filter loudnesses of each of the frequency bands on the wide dynamic range compression curves of the frequency bands and second output loudnesses corresponding to the filter loudnesses of the frequency bands on the unit gain curve.

\* \* \* \* \*